(12) United States Patent
Hirai et al.

(10) Patent No.: US 7,667,232 B2
(45) Date of Patent: Feb. 23, 2010

(54) BANK STRUCTURE, METHOD OF FORMING BANK STRUCTURE, DEVICE, ELECTRO-OPTICAL DEVICE AND ELECTRONIC APPARATUS

(75) Inventors: Toshimitsu Hirai, Chino (JP); Shinri Sakai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 529 days.

(21) Appl. No.: 11/223,015

(22) Filed: Sep. 12, 2005

(65) Prior Publication Data

US 2006/0078830 A1    Apr. 13, 2006

(30) Foreign Application Priority Data

Oct. 13, 2004    (JP)    ............................. 2004-298450

(51) Int. Cl.
*H01L 29/04*    (2006.01)
*H01L 21/00*    (2006.01)

(52) U.S. Cl. ............................. 257/59; 257/72; 438/30

(58) Field of Classification Search .................. 257/57, 257/59, 66, 72, E21.023, E21.024, E21.025, 257/E21.026, E21.027, E21.028; 438/30
See application file for complete search history.

(56) References Cited

U.S. PATENT DOCUMENTS 6,300,683 B1 * 10/2001 Nagasaka et al. ........... 257/774

FOREIGN PATENT DOCUMENTS

| JP | A 11-274671 | 10/1999 |
|---|---|---|
| JP | A 2000-216330 | 8/2000 |
| JP | A-2004-022898 | 1/2004 |
| JP | A-2005-032835 | 2/2005 |

* cited by examiner

*Primary Examiner*—Hung Vu
(74) *Attorney, Agent, or Firm*—Oliff & Berridge, PLC

(57) ABSTRACT

A bank structure in which a recess corresponding to a pattern formed of a functional liquid is provided includes first recess provided corresponding to a first pattern, and a second recess provided on part of the first recess and corresponding to a second pattern. The second recess has a shape that has a width larger than a width of the first recess and has a circular arc in at least part of an outer circumference of the second recess.

11 Claims, 11 Drawing Sheets

A-A'

BANK STRUCTURE, METHOD OF FORMING BANK STRUCTURE, DEVICE, ELECTRO-OPTICAL DEVICE AND ELECTRONIC APPARATUS

This nonprovisional application claims the benefit of Japanese Patent Application No. 2004-298450, filed Oct. 13, 2004. The entire disclosure of the prior applications is hereby incorporated by reference herein in its entirety.

BACKGROUND OF THE INVENTION

1. Technical Field

The present invention relates to a bank structure, a method of forming a bank structure, a device, an electro-optical device and an electronic apparatus.

2. Related Art

As a method for forming wires and the like having a certain pattern and used for an electronic circuit, an integrated circuit and the like, photolithography has been widely used for example. The photolithography requires large-scale equipment, such as a vacuum apparatus, exposure apparatus and so on. In forming wires and the like having a certain pattern by using the above-described devices, complicated steps are required and the material use efficiency is about several percentages, i.e., most of the material needs to be wasted, leading to the problem of high manufacturing costs.

In contrast, a method has been proposed in which wires and the like having a certain pattern are formed on a substrate by using a droplet discharge method for discharging a liquid material in a droplet form from liquid discharge heads, i.e., a so-called ink jet method. This method is disclosed in Japanese Unexamined Patent Publications No. 11-274671 and 2000-216330 for example. In the ink jet method, a liquid material (functional liquid) for patterning is directly deposited on a substrate with being patterned, and thereafter the deposited material is converted to a pattern by heat treatment or laser irradiation. Therefore, this method offers advantages of simplifying processes significantly since photolithography steps are unnecessary, and of reducing the use amount of the material since a row material can directly be deposited on patterning positions.

In recent years, the density of circuits constituting devices has been increasing, and therefore further miniaturization and line-width reduction of wires have been also required for example. In a pattern forming method using the above-described droplet discharge method, since discharged droplets spread over a substrate after landing thereon, it is difficult to stably form minute patterns. Particularly if an electrical conductive film pattern is to be formed, formation of liquid swelling (bulge) resulting from the above-described spreading of droplets may cause defects, such as disconnection and short-circuit.

Therefore, another technique has been also proposed. In this technique, banks to define wire-formation regions are formed, and a functional liquid is discharged toward the wire-formation regions in the state in which the surfaces of the banks have been provided with lyophobicity. Thus, wires having a width smaller than the diameter during flight of the functional liquid discharged by the droplet discharge method are formed. By forming banks to define wire-formation regions as described above, even if part of the functional liquid is discharged on the upper surfaces of the banks, the functional liquid flows into the entire wire-formation regions since the upper surfaces of the banks have been provided with lyophobicity.

However, in recent years, the fact has been probed that contact of part of the functional liquid with the upper surfaces of the banks results in remaining of minute residues on the upper surfaces of the banks. If the functional liquid has electrical conductivity, for example, the residues also have electrical conductivity. Therefore, if the residues remain on the upper surfaces of the banks as described above, electrical characteristics of the wiring pattern itself and characteristics of a device employing the wires may change.

SUMMARY

An advantage of the invention is to provide a bank structure, a pattern forming method, an electro-optical device and an electronic apparatus that each allows precise and stable formation of a minute pattern in a small-width line form.

One aspect of the invention is to provide a bank structure in which a recess corresponding to a pattern formed of a functional liquid is provided. The bank structure includes a first recess provided corresponding to a first pattern, and a second recess provided on part of the first recess and corresponding to a second pattern. The second recess has a shape that has a width larger than a width of the first recess and has a circular arc in at least part of an outer circumference of the second recess.

Here, the width of the first recess is the distance from one end of the first recess to the other end along a direction perpendicular to the longitudinal direction of the first recess. The width of the second recess is the minimum distance of distances between the intersections of an axis passing through the center of the second recess and the outer circumference of the second recess.

Typically the recess of the bank, provided to prevent spreading of the functional liquid in forming a pattern, is formed in a rectangular shape. In addition, in the case of forming a pattern by a droplet discharge method, the shape of the functional liquid discharged from the droplet discharge device has a circular shape. Therefore, if the width of the first pattern is smaller than the diameter during flight of the discharged functional liquid, for example, part of the functional film remains on the upper surface of the bank. In contrast, according to the aspect of the invention, the second recess has a shape that has a width larger than the width of the first recess and has a circular arc in at least part of the outer circumference thereof. Thus, the width of the second recess has such magnitude to match the diameter during flight of the functional liquid discharged from the droplet discharge device. Therefore, the discharged functional liquid is accommodated without spilling out from the second recess. Thus, a pattern having a desired shape can be formed. In addition, short-circuit and so on due to residues on the upper surface of the bank can be prevented, which can realize a pattern having desired electrical characteristics.

In the bank structure, it is also preferable that the second recess has a round shape in plan view.

According to this structure, the shape of a region on which the functional liquid is deposited is equal to the planar shape of the discharged functional liquid. If the second recess has a rectangular shape for example, there may be a case in which the discharged functional liquid dose not spread to the corners of the second recess and therefore a pattern having a desired shape is not formed. Therefore, if the shape of the second recess is a round shape, the area of a region on which the functional liquid is discharged can be minimized, and thus costs of the functional liquid can be reduced. Moreover, the discharged functional liquid can be accommodated in the second recess without spilling out onto the upper surface of the bank.

It is also preferable that the bank structure further includes a third recess provided corresponding to a third pattern that is coupled to the first pattern and has a width larger than a width of the first pattern.

In general, when forming a first pattern that is a minute pattern, it is difficult to directly discharge the functional liquid in the recess corresponding to the first pattern if the width of the minute pattern is smaller than the diameter during flight of the functional liquid. In contrast, in the aspect of the invention, the third recess is formed to have a width larger than the width of the first pattern. Therefore, by utilizing a capillary phenomenon, the functional liquid discharged in the third recess can be deposited in the first recess, which is narrower than the third recess. In addition, one end of the first recess is coupled to the second recess while the other end is coupled to the third recess. Therefore, the functional liquid flows from both ends of the first recess, which enables the functional liquid to uniformly spread over the entire first recess. Thus, a pattern having a desired shape can be formed and a pattern having excellent electrical characteristics can be formed.

It is also preferable that the bank structure further includes a third recess corresponding to a third pattern that is coupled to the second pattern.

According to this structure, the third recess corresponding to the third pattern is coupled to the second pattern. Therefore, even if the diameter during flight of the discharged functional liquid is larger than the width of the first recess, the second recess allows the discharged functional liquid to be accommodated therein without spilling out onto the bank, and thus allows the functional liquid to spread to the third recess. Thus, a pattern having a desired shape can be formed and a pattern having excellent electrical characteristics can be formed.

Another aspect of the invention is to provide a method of forming a bank structure that has recesses corresponding to a plurality of patterns on a substrate. The method includes applying a bank material on the substrate, forming a first recess corresponding to a first pattern in the bank material, and forming a second recess corresponding to a second pattern on part of the first recess in the bank material. The second recess has a shape that has a width larger than a width of the first recess and has a circular arc in at least part of an outer circumference of the second recess.

According to the method of forming a bank structure of the aspect of the invention, the second recess has a shape that has a width larger than the width of the first recess and has a circular arc in at least part of the outer circumference thereof. Thus, the width of the second recess has such magnitude to match the diameter during flight of the functional liquid discharged from the droplet discharge device. Therefore, the discharged functional liquid is accommodated without spilling out from the second recess. Thus, a pattern having a desired shape can be formed. In addition, short-circuit and so on due to residues on the upper surface of the bank can be prevented, which can realize a pattern having desired electrical characteristics.

Another aspect of the invention is to provide a device including a semiconductor layer provided over a substrate, source and drain electrodes coupled to the semiconductor layer, and a gate electrode provided facing the semiconductor layer with an insulating film therebetween. The device includes the above-described bank structure, and a pattern disposed in each of the first and second recesses of the bank structure. The first pattern is the drain electrode.

By using the above-described bank structure, the drain electrode having a desired shape can be formed without leaving residues of the functional liquid on the upper surface of the bank. Thus, a device having excellent electrical characteristics can be provided while preventing short-circuit, disconnection and so on of wires and the like formed on the upper surface of the bank.

Another aspect of the invention is to provide a device including a semiconductor layer provided over a substrate, source and drain electrodes coupled to the semiconductor layer, and a gate electrode provided facing the semiconductor layer with an insulating film therebetween. The device includes the above-described bank structure, and a pattern disposed in each of the first, second and third recesses of the bank structure. The first pattern is the gate electrode and the third pattern is a gate wire.

By using the above-described bank structure, the gate wire and gate electrode having a desired shape can be formed without leaving residues of the functional liquid on the upper surface of the bank. Thus, a device having excellent electrical characteristics can be provided while preventing short-circuit, disconnection and so on of wires and the like formed on the upper surface of the bank.

Another aspect of the invention is to provide a device including a semiconductor layer provided over a substrate, source and drain electrodes coupled to the semiconductor layer, and a gate electrode provided facing the semiconductor layer with an insulating film therebetween. The device includes the above-described bank structure, and a pattern disposed in each of the first, second and third recesses of the bank structure. The first pattern is a source wire and the third pattern is the source electrode.

By using the above-described bank structure, the source wire and source electrode having a desired shape can be formed without leaving residues of the functional liquid on the upper surface of the bank. Thus, a device having excellent electrical characteristics can be provided while preventing short-circuit, disconnection and so on of wires and the like formed on the upper surface of the bank.

In the device, it is also preferable that an area of a horizontal overlap between the source electrode and the semiconductor layer is almost equal to an area of a horizontal overlap between the drain electrode and the semiconductor layer.

This structure can realize a device involving no signal delay and having excellent electrical characteristics.

An electro-optical device of an embodiment of the invention includes the above-described device. In addition, electronic apparatus of an embodiment of the invention includes the electro-optical device.

According to the aspects of the invention, the electro-optical device and electronic apparatus having improved quality and performance can be realized since they are provided with the device having excellent electrical characteristics.

Here, in the present invention, the term electro-optical device is a generic name that encompasses a device employing an electro-optical effect to change the optical transparency based on refraction index changes of a substance caused by an electric field, a device converting electric energy into optical energy, and other devices. Specifically, a liquid crystal display employing a liquid crystal as an electro-optical substance, an organic EL device employing organic electro-luminescence (EL), an inorganic EL device employing inorganic EL, a plasma display device employing a plasma gas as an electro-optical substance, and the like are cited. Furthermore, an electrophoretic display (EPD), a field emission display (FED) and the like are cited.

BRIEF DESCRIPTION OF THE DRAWINGS

The invention will be described with reference to the accompanying drawings, wherein like numbers refer to like elements, and wherein.

DESCRIPTION OF THE EMBODIMENTS

First Embodiment

One preferred embodiment of the invention will be described below with reference to the drawings. It should be note that the embodiments to be described below illustrate part aspects of the invention, and do not limit the invention. In each drawing used for the following description, in order to illustrate each layer and each member with such size to be recognizable on the drawings, the scale thereof is adequately changed for each layer and each member.

Droplet Discharge Device

Initially, a droplet discharge device for forming thin film patterns in the present embodiment will be described referring to FIG. 1.

Figure 1:
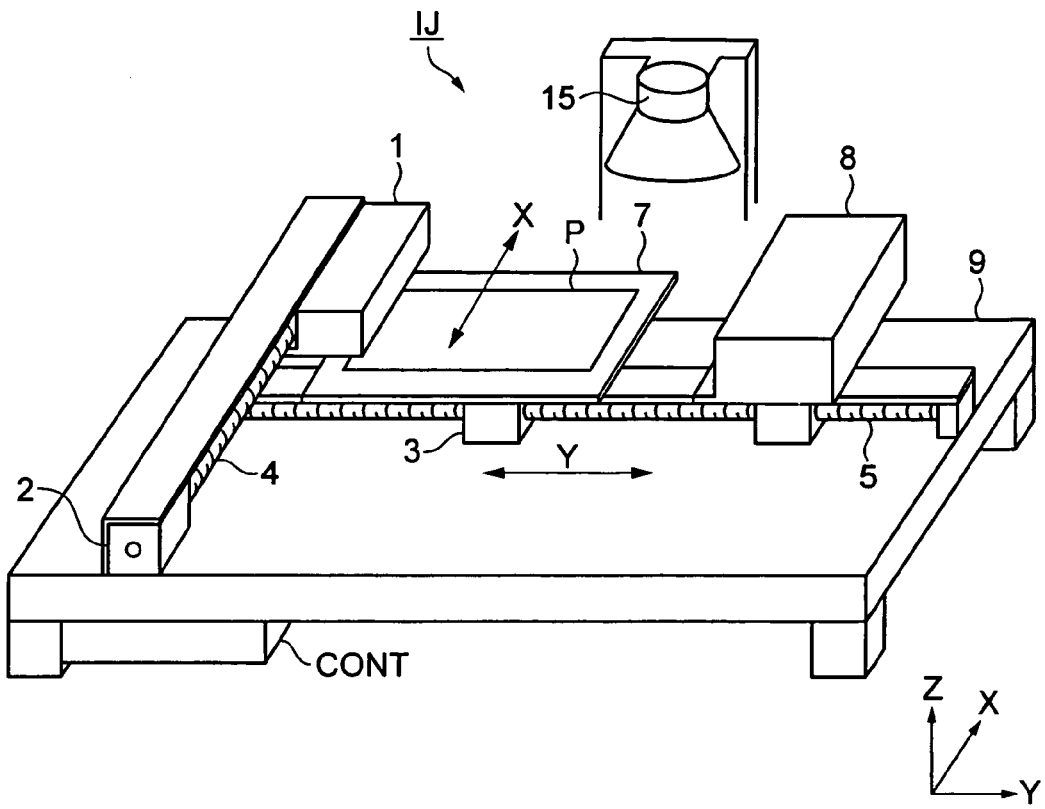
FIG. 1 is a perspective view illustrating the schematic structure of a droplet discharge device according to an embodiment of the invention.

FIG. 1 is a perspective view illustrating the schematic configuration of a droplet discharge device (ink jet device) IJ for depositing a liquid material on a substrate by the droplet discharge method, as one example of a device used for a pattern forming method of an embodiment of the invention.

The droplet discharge device IJ includes a droplet discharge head 1, an X-axis direction drive shaft 4, a Y-axis direction guide shaft 5, a control device CONT, a stage 7, a cleaning mechanism 8, a base 9, and a heater 15.

The stage 7 supports a substrate P to which ink (a liquid material) is provided by the droplet discharge device IJ, and includes a fixing mechanism (not shown) for fixing the substrate P to a reference position.

The droplet discharge head 1 is a multi-nozzle type droplet discharge head including a plurality of discharge nozzles. The longitudinal direction of the head 1 coincides with the Y-axis direction. The plurality of nozzles is provided on the lower surface of the droplet discharge head 1 with being arranged along the Y-axis direction at a constant interval. Ink containing conductive fine particles is discharged from the discharge nozzles of the droplet discharge head 1 to the substrate P supported by the stage 7.

An X-axis direction drive motor 2 is connected to the X-axis direction drive shaft 4. The X-axis direction drive motor 2 is a stepping motor or the like and rotates the X-axis direction drive shaft 4 when a driving signal for the X-axis direction is supplied from the control device CONT. The rotation of the X-axis direction drive shaft 4 causes the movement of the droplet discharge head 1 along the X-axis direction.

The Y-axis direction guide shaft 5 is fixed to the base 9 so as not to move. The stage 7 is equipped with a Y-axis direction drive motor 3. The Y-axis direction drive motor 3 is a stepping motor or the like, and moves the stage 7 along the Y-axis direction when a driving signal for the Y-axis direction is supplied from the control device CONT.

The control device CONT supplies to the droplet discharge head 1 voltages for controlling droplet discharge. Furthermore, the control device CONT also supplies to the X-axis direction drive motor 2 a drive pulse signal for controlling the movement of the droplet discharge head 1 along the X-axis direction, and to the Y-axis direction drive motor 3 a drive pulse signal for controlling the movement of the stage 7 along the Y-axis direction.

The cleaning mechanism 8 cleans the droplet discharge head 1. The cleaning mechanism 8 is equipped with a drive motor (not shown) for the Y-axis direction. Driving by the Y-axis direction drive motor causes the movement of the cleaning mechanism 8 along the Y-axis direction guide shaft 5. The movement of the cleaning mechanism 8 is also controlled by the control device CONT.

The heater 15 is a unit to subject the substrate P to heat treatment by lump annealing, and evaporates and dries the solvent contained in a liquid material applied on the substrate P. Turning on and off of power supply to the heater 15 are also controlled by the control device CONT.

The droplet discharge device IJ discharges droplets to the substrate P while causing the droplet discharge head 1 to scan the stage 7 supporting the substrate P. In the following explanations, the X-axis direction is defined as a scan direction, while the Y-axis direction perpendicular to the X-axis direction is defined as a non-scan direction. Therefore, the discharge nozzles of the droplet discharge head 1 are arranged along the Y-axis direction, which is the non-scan direction, at a constant interval. Although in FIG. 1, the droplet discharge head 1 is disposed at a right angle to the moving direction of the substrate P, the angle of the droplet discharge head 1 may be adjusted so that the longitudinal direction of the head 1 and the moving direction of the substrate P intersect at an oblique angle. This angle adjustment allows controlling of the pitch between the nozzles. In addition, a function of adjusting the distance between the substrate P and the nozzle surface to any value may be provided.

Figure 2:
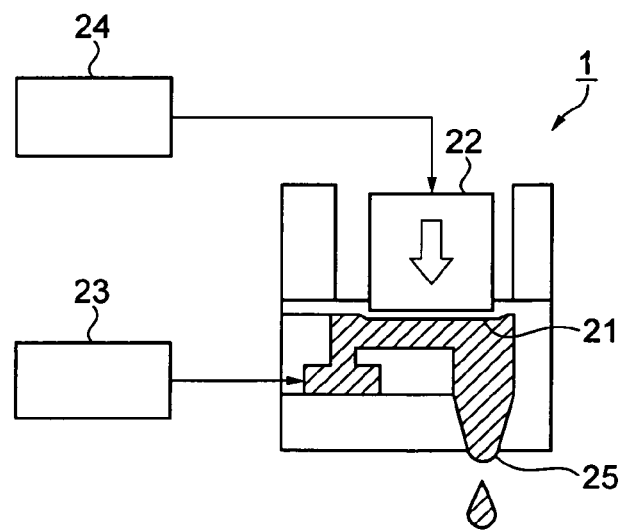
FIG. 2 is a diagram for explaining a principle of discharging liquid by a piezo method.

FIG. 2 is a diagram explaining a principle of discharging a liquid material by a piezo method.

Referring to FIG. 2, a piezo element 22 is disposed adjacent to a liquid chamber 21 storing a liquid material (ink for patterning wires, functional liquid). The liquid material is supplied to the liquid chamber 21 through a liquid material supply system 23 including a material tank for storing the liquid material.

The piezo element 22 is connected to a driving circuit 24. A voltage is applied to the piezo element 22 via the driving circuit 24 to deform the piezo element 22, so that the liquid chamber 21 is deformed to discharge the liquid material from a nozzle 25. In this case, the strain amount of the piezo element 22 is controlled by changing the value of the applied voltage. In addition, the strain velocity of the piezo element 22 is controlled by changing the frequency of the applied voltage.

As a principle of discharging a liquid material, besides the above-described piezo method employing a piezo element, which is a piezoelectric element, to discharge ink, various publicly-known techniques, such as a bubble method in which a liquid material is heated and generated bubbles cause the liquid material to be discharged, can be applied. Of these methods, the above-described piezo method has an advantage of having no influence on the material composition and so on because no heat is applied to the liquid material.

A functional liquid L is composed of a dispersion liquid including conductive fine particles dispersed in a dispersion medium, or a solution including an organic silver compound or silver oxide nanoparticles dispersed in a solvent (dispersion medium). As the conductive fine particles, for example, metal fine particles including any of gold, silver, copper, palladium, and nickel are used. Alternatively, fine particles of an oxide of these metals, fine particles of a conductive polymer or a super-conductive material, or other fine particles are used. These conductive fine particles may be used while the surface thereof is coated with an organic substance in order to enhance the dispersibility. It is preferable that the particle diameter of the conductive fine particles be at least 1 nm and at most 0.1 μm. If the diameter is larger than 0.1 μm, there is a possibility of clogging in the nozzles of the liquid discharge head to be described later. In addition, if the diameter is smaller than 1 nm, the volume ratio of a coating agent to the conductive fine particles is large, resulting in an excess percentage of the organic substance in the obtained film.

There is no particular limitation on the dispersion medium as long as it can disperse the above-described conductive fine particles and does not cause aggregation. For example, besides water, the following materials can be exemplified: alcohols such as methanol, ethanol, propanol, and butanol; hydro-carbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis (2-methoxyethyl)ether, and p-dioxane; polar compounds such as propylene carbonate, gamma-butyrolactone, N-methyl-2-pyrrolidone, dimethylformamide, dimethyl sulfoxide, and cyclohexanone; and so on. Of these materials, water, alcohols, carbon hydride compounds, and ether compounds are preferable in terms of dispersibility of fine particles, stability of a dispersion liquid and ease of application to a droplet discharge method (ink jet method). As a more preferable dispersion medium, water and carbon hydride compounds can be cited.

It is preferable that the surface tension of the dispersion liquid of the above-described conductive fine particles be in the range of 0.02 N/m to 0.07 N/m. In discharging a liquid by a droplet discharge method, if the surface tension is below 0.02 N/m, the wettability of the ink composition to the nozzle surface is increased and thus flight deflection is easily caused. If the surface tension exceeds 0.07 N/m, the meniscus shape at the tip of the nozzle is unstable, which makes it difficult to control discharge timing. In order to adjust the surface tension, a small amount of a surface tension regulating agent, such as a fluorine-based, silicone-based, or nonionic-based agent, may be added to the above-described dispersion liquid to such an extent that the contact angle of the liquid to the substrate is not significantly lowered. The nonionic-based surface tension regulating agent serves to enhance the wettability of a liquid to a substrate, and improve the leveling property of a film to prevent generation of minute recesses and projections of a film. The surface tension regulating agent may include, if needed, an organic compound, such as alcohol, ether, ester, or ketone.

It is preferable that the viscosity of the above-described dispersion liquid be at least 1 mPa-s and at most 50 mPa-s. In discharging a liquid material as droplets by a droplet discharge method, if the viscosity is below 1 mPa-s, the peripheral parts of the nozzles are easily contaminated due to flow out of ink. If the viscosity is greater than 50 mPa-s, the frequency of clogging in nozzle openings is increased, which makes it difficult to discharge droplets smoothly.

Bank Structure

Figure 3:
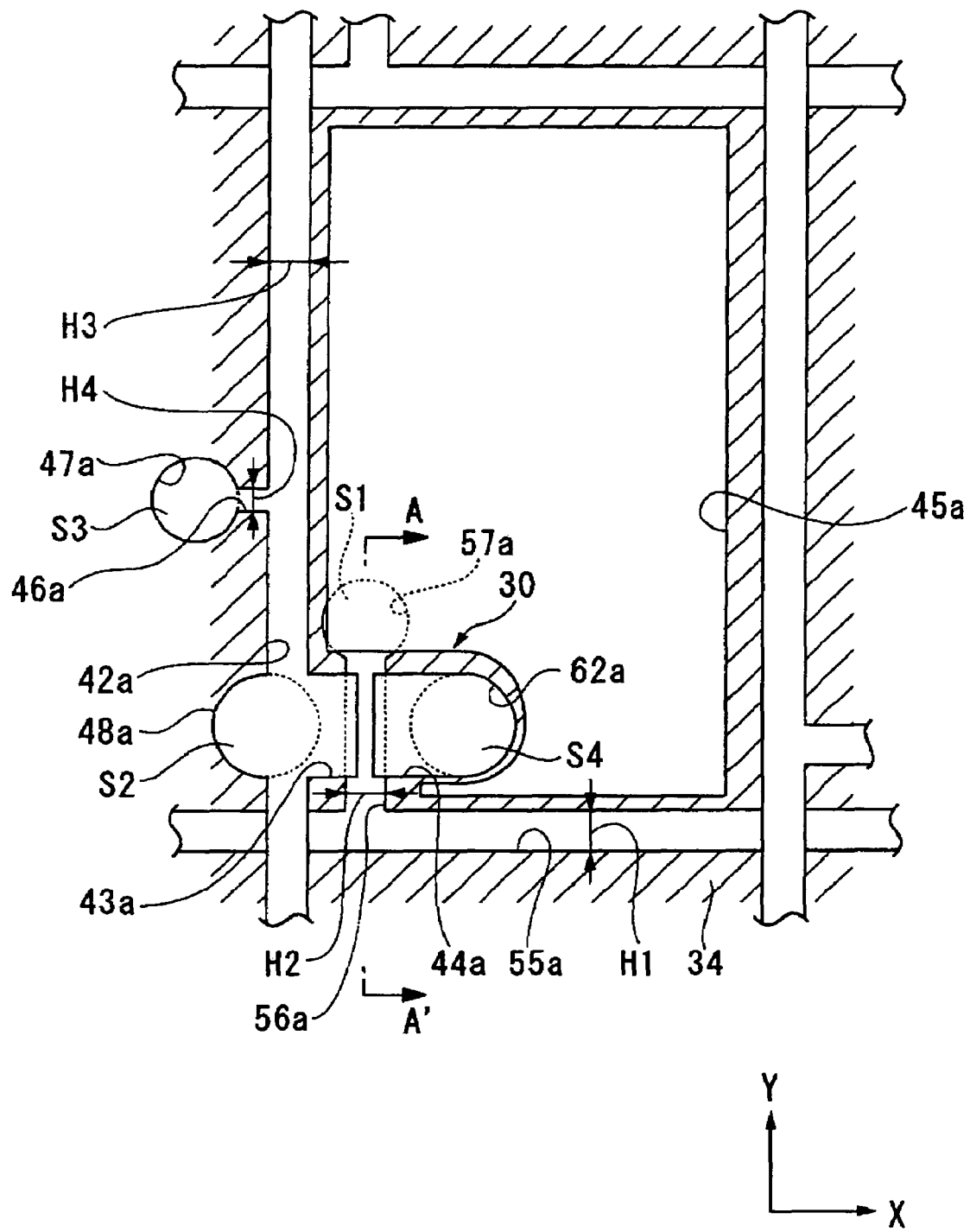
FIG. 3 is a plan view schematically illustrating a bank structure.

Next, referring to FIG. 3, a bank structure constituting one pixel will be described in detail. FIG. 3 is a plan view schematically illustrating a bank structure that constitutes one pixel (including a TFT). In order to facilitate understanding of the present embodiment, only a bank structure used for actually constituting one pixel is picked out and described referring to FIG. 3. In addition, in FIG. 3, banks formed in different layers are commonly illustrated and described for convenience. In each drawing, in order to illustrate each layer and each member with such size to be recognizable on the drawings, the scale thereof is adequately changed for each layer and each member.

Initially, a first layer shown in FIG. 3 will be described in detail with reference to FIGS. 3 and 4A.

Figure 4A:
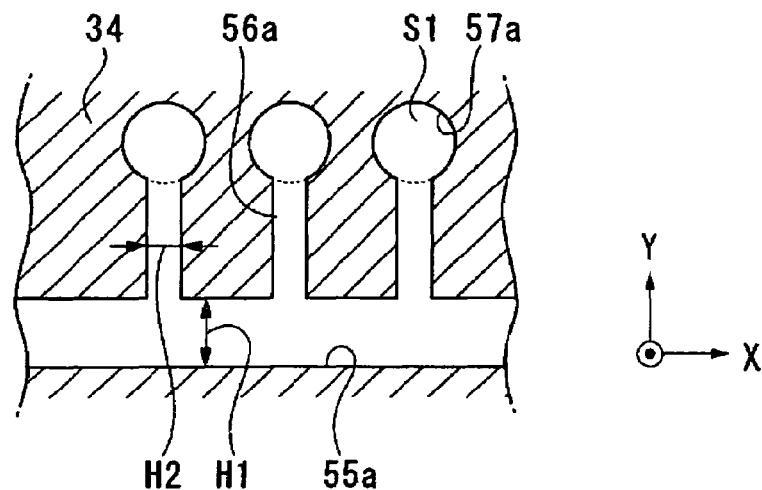
FIGS. 4A to 4C are plan views schematically illustrating bank structures that correspond to a gate electrode, a source electrode and a drain electrode, respectively.

FIG. 4A is a plan view that picks up and illustrates in a magnified form, a first layer of a bank structure constituting one pixel, shown in FIG. 3. Referring to FIGS. 3 and 4A, in a bank 34 of the first layer for constituting one pixel, a gate wire trench 55a (a third recess) corresponding to a gate wire and a gate electrode trench 56a (a first recess) corresponding to a gate electrode are formed.

The gate wire trench 55a is formed to extend along the X-axis direction and has a width H1. The width H1 of the gate wire trench 55a is equal to or larger than the diameter during flight of the functional liquid L discharged from the above-described droplet discharge device IJ. Therefore, the gate wire trench 55a has such a structure that the discharged functional liquid L does not spill out onto the upper surface of the bank 34.

The gate electrode trench 56a is formed to extend along the Y-axis direction. A base end of the gate electrode trench 56a is coupled substantially perpendicularly to the gate wire trench 55a. In addition, the gate electrode trench 56a has a width H2. The width H2 of the gate electrode trench 56a is smaller than the width H1 of the above-described gate wire trench 55a. Specifically, the width H2 is smaller than the diameter during fight of the functional liquid L discharged from the droplet discharge device IJ. Therefore, it is difficult to directly discharge the functional liquid L to the gate electrode trench 56a. Thus, the present embodiment has such a structure that the functional liquid L discharged to the gate wire trench 55*a* is supplied to the gate electrode trench 56*a* by a capillary phenomenon.

In the present embodiment, a gate electrode auxiliary trench 57*a* (a second recess) that has a round shape in plan view is formed at a tip of the gate electrode trench 56*a*. The gate electrode auxiliary trench 57*a* constitutes part of the gate electrode trench 56*a*. Furthermore, the gate electrode auxiliary trench 57*a* is formed so that the width of the round shape is almost equal to or larger than the diameter during flight of the functional liquid L discharged from the droplet discharge device IJ. That is, in the present embodiment, the gate electrode auxiliary trench 57*a* serves as a region S1 to which the functional liquid L is discharged, and has such a structure that the functional liquid L does not spill out onto the upper surface of the bank 34.

By thus providing the gate electrode auxiliary trench 57*a*, one end of the gate electrode trench 56*a* is coupled to the gate wire trench 55*a* while the other end is coupled to the gate electrode auxiliary trench 57*a*. The gate wire trench 55*a* and the gate electrode auxiliary trench 57*a* serve as regions to which the functional liquid L is discharged as described above. Therefore, the gate electrode trench 56*a* is supplied with the functional liquid L from both ends without the liquid L spilling out onto the upper surface of the bank 34. Thus, the functional liquid L can spread over the entire gate electrode trench 56*a*, and therefore a pattern having a desired shape can be formed.

Subsequently, a second layer shown in FIG. 3 will be described in detail with reference to FIGS. 3, 4B and 4C.

Figure 4B:
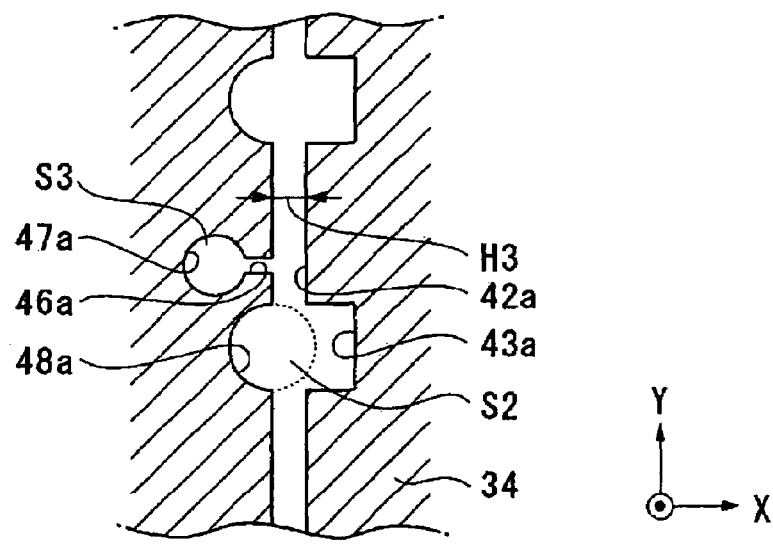
Figure 4C:
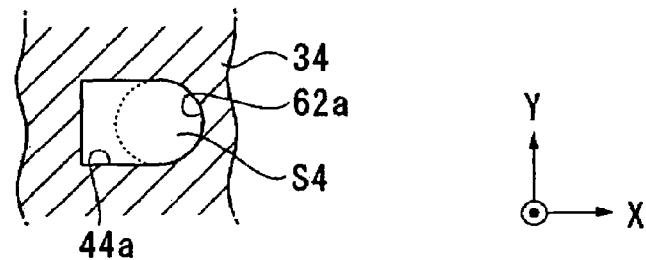

FIGS. 4B and 4C are plan views that pick up and illustrate in a magnified form, a second layer of the bank structure constituting one pixel, shown in FIG. 3. Referring to FIGS. 3, 4B and 4C, in the bank 34 of the second layer for constituting one pixel, a source wire trench 42*a* (the first recess) corresponding to a source wire, a source electrode trench 43*a* (the third recess), and a drain electrode trench 44*a* (the first recess) corresponding to a drain electrode are formed above the bank for the gate wire and electrode. The bank for the source wire and electrode, and the drain electrode is removed after formation of the source wire and electrode, and the drain electrode as described later.

The source wire trench 42*a* is formed to extend along the Y-axis direction and intersect the above-described gate wire trench 55*a*. In addition, the source wire trench 42*a* has a width H3. The width H3 is smaller than the diameter during flight of the functional liquid L discharged from the droplet discharge device IJ. It is also preferable that the width H3 of the source wire trench 42*a* is equal to or lager than the diameter during flight of the functional liquid L like the above-described gate wire trench 55*a*.

Furthermore, as shown in FIGS. 3 and 4B, the source electrode trench 43*a* is formed to extend from the source wire trench 42 in the X-axis direction near the intersection between the source wire trench 42*a* and the gate wire trench 55*a*.

In the present embodiment, a region of combination of the source wire trench 42*a* and the source electrode trench 43*a* is smaller than the diameter during flight of the discharged functional liquid L, and therefore is a minute pattern.

A source wire auxiliary trench 48*a* (the second recess) is formed for the source wire trench 42*a*. As shown in FIGS. 3 and 4B, the source wire auxiliary trench 48*a* is formed in a round shape in plan view, and is provided to overlap part of the source wire trench 42*a* and the source electrode trench 43*a*. In addition, part of the source wire auxiliary trench 48*a* is provided to face the source electrode trench 43*a* and extend from the source wire trench 42*a* in a semicircular shape in plan view. The width of the source wire auxiliary trench 48*a* is equal to or larger than the diameter during flight of the functional liquid L discharged from the droplet discharge device IJ. Therefore, the source wire auxiliary trench 48*a* serves as a region S2 to which the functional liquid L is discharged, and has such a structure that the functional liquid L does not spill out onto the upper surface of the bank 34.

In addition, as shown in FIGS. 3 and 4B, a second source wire auxiliary trench 47*a* (the second recess) is formed between the source electrode trenches 43*a* and 43*a*. The source wire auxiliary trench 47*a* is connected substantially perpendicularly to the source wire trench 42*a* and is formed to extend along the X-axis direction. The source wire auxiliary trench 47*a* is formed in a round shape in plan view, and is formed to be almost equal to or larger than the diameter during flight of the functional liquid L discharged from the droplet discharge device IJ. Specifically, in the present embodiment, the source wire auxiliary trench 47*a* serves as a region S3 to which the functional liquid L is discharged. Therefore, by discharging the functional liquid L to the source wire auxiliary trench 47*a*, the functional liquid L can be disposed without spilling out from the trench, and can be supplied to the source wire trench 42*a*.

Subsequently, the drain electrode trench 44*a* formed in the bank of the second layer shown in FIGS. 3 and 4C will be described. FIG. 4C is a plan view that picks up and illustrates in a magnified form, the second layer of the bank structure constituting one pixel, shown in FIG. 3. In the bank 34 of the second layer of FIG. 3, the drain electrode trench 44*a* (the first recess) corresponding to the drain electrode is formed.

The drain electrode trench 44*a* is formed to face the source electrode trench 43*a*. In addition, the drain electrode trench 44*a* is formed in a rectangular shape as with the source electrode trench 43*a*, and is formed so that the planar areas of the source electrode trench 43*a* and the drain electrode trench 44*a* are almost the same.

A drain electrode auxiliary trench 62*a* is formed for the drain electrode trench 44*a*. The drain electrode auxiliary trench 62*a* has a round shape in plan view, and is provided so that part thereof overlaps the drain electrode trench 44*a*. In addition, the drain electrode auxiliary trench 62*a* is formed to extend in a semicircular shape in plan view from the drain electrode trench 44*a*. The width of the drain electrode auxiliary trench 62*a* is equal to or larger than the diameter during flight of the functional liquid L discharged from the droplet discharge device IJ. In the present embodiment, the drain electrode auxiliary trench 62*a* serves as a region S4 to which the functional liquid L is discharged, and has such a structure that the functional liquid L does not spill out onto the upper surface of the bank 34.

Next, the third layer of FIG. 3 will be described in detail with reference to FIG. 3.

As shown in FIG. 3, a pixel electrode trench 45*a* corresponding to the pixel electrode is formed in a region defined by the gate wire trench 55*a* and the source wire trench 42*a*. Furthermore, the pixel electrode trench 45*a* is formed so that part thereof overlaps the drain electrode trench 44*a* and the drain electrode auxiliary trench 62*a*.

According to the present embodiment, the shape of the region (the gate electrode auxiliary trench 57*a*) on which the functional liquid L is disposed is equal to the shape during flight of the discharged functional liquid L. Therefore, the discharged functional liquid L can be accommodated in the gate electrode auxiliary trench 57*a* without spilling out onto the upper surface of the bank 34 and the like, so as to be supplied to the gate electrode trench 56*a*. The source wire auxiliary trenches 47a and 48a, and the drain electrode auxiliary trench 62a also achieve the same operation and advantages as those of the gate electrode auxiliary trench 57a.

Bank Structure and Pattern Forming Method

FIGS. 5A to 5D and 6A to 6C are sectional views illustrating a bank structure and a pattern forming method in the order of steps. FIGS. 5A to 5D are diagrams illustrating a sectional part along the line A-A' of the bank structure shown in FIG. 3, i.e., the gate electrode trench, the gate wire trench and a pattern forming method. Since forming steps for the source electrode trench, source wire trench, drain electrode trench and so on, which constitute other bank structures shown in FIG. 3, are similar to the forming step for a gate electrode, the description thereof will be omitted in the present embodiment.

Bank Material Applying Step

Figure 5A:
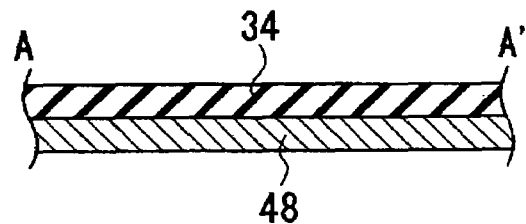
FIGS. 5A to 5D are sectional views illustrating a method of forming a wiring pattern.

First, as shown in FIG. 5A, a bank material is applied over the entire surface of a substrate 48 by spin coating. For the substrate 48, any of various materials, such as glass, quartz glass, a Si wafer, a plastic film and a metal plate, can be used. In addition, as the bank material, an insulating material composed of photosensitive polysilazane, acrylic resin, polyimide or the like can be used. Thus, since the bank material also has a function of resist, a step of applying resist can be omitted.

It is also preferable that an underlying layer, such as a semiconductor film, metal film, dielectric film or organic film, is formed on the surface of the substrate 48. In addition, as a method of applying the bank material, any of various materials, such as spray coating, roll coating, die coating and dip coating, can be applied.

Figure 5B:
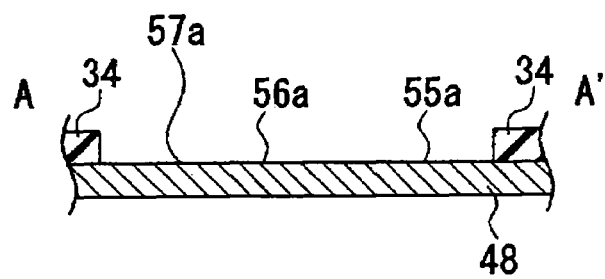
Figure 6A:
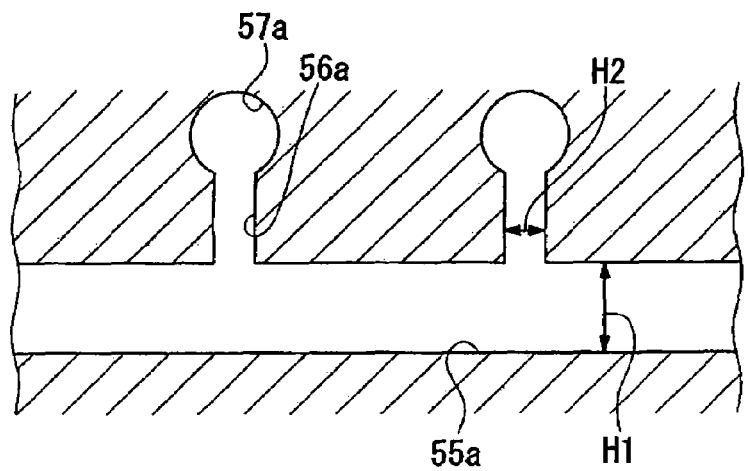
FIGS. 6A to 6C are plan views illustrating a method of forming a wiring pattern.

Subsequently, as shown in FIGS. 5B and 6A, the gate wire trench 55a, the gate electrode trench 56a and the gate electrode auxiliary trench 57a are formed by photolithography. Photochemical reaction used in development treatment in the following photolithography treatment is on the premise of using a positive type resist.

Specifically, first, a certain mask pattern is transferred to the bank 34 by an exposure device with using a photo mask. As the photo mask, a mask in which the following pattern is opened is used: in the region corresponding to the gate wire trench 55a, the width H1 of the gate wire trench 55a is equal to or larger than the diameter during flight of the functional liquid L discharged from the droplet discharge device IJ; in the region corresponding to the gate electrode trench 56a, the width H2 of the gate electrode trench 56a is equal to or larger than the diameter during flight of the functional liquid L discharged from the droplet discharge device IJ; and in the region corresponding to the gate electrode auxiliary trench 57a, the shape of the gate electrode auxiliary trench 57a is a round shape in plan view, and the width of the round shape is equal to or larger than the diameter during flight of the functional liquid L discharged from the droplet discharge device IJ.

Subsequently, development treatment is implemented for the bank 34 to which the mask pattern has been transferred (exposure treatment). Since a positive type resist (the bank 34) is used in the present embodiment, the bank 34 on a region irradiated with exposure light is solved. Thus, as shown in FIG. 6A, the gate wire trench 55a, the gate electrode trench 56a and the gate electrode auxiliary trench 57a are formed in the bank 34.

Lyophobicity Providing Treatment Step

Next, plasma treatment is implemented for the surface of the bank material applied on the entire surface of the substrate 48 with employing a gas including fluorine, such as a $CF_4$, $SF_5$, or $CHF_3$ gas, as a treatment gas. This plasma treatment provides the surface of the bank material with lyophobicity. As a method for lyophobicity providing treatment, for example, a plasma treatment method employing tetrafluoromethane as the treatment gas in an air atmosphere ($CF_4$ plasma treatment method) can be adopted. Conditions for this $CF_4$ plasma treatment are as follows, for example: a plasma power of 50-1000 W, a tetrafluoromethane gas flow rate of 50-100 ml/min, a substrate conveying rate relative to a plasma discharge electrode of 0.5-1020 mm/sec, and a substrate temperature of 70-90° C.

Note that the above-described treatment gas is not limited to tetrafluoromethane (tetrafluorocarbon), but another fluorocarbon gas can also be used.

Residue Treatment Step

Next, in order to remove residues of the resist (organic substance) used for forming the bank in which the gate wire trench 55a and the gate electrode trench 56a are formed, residue treatment is implemented for the substrate 48. As a method for the residue treatment, any of various methods employing a developer, acid or the like can be adopted.

Functional Liquid Deposition Step

Figure 5C:
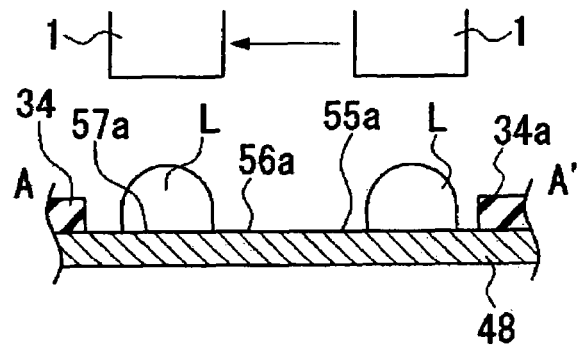
Figure 6B:
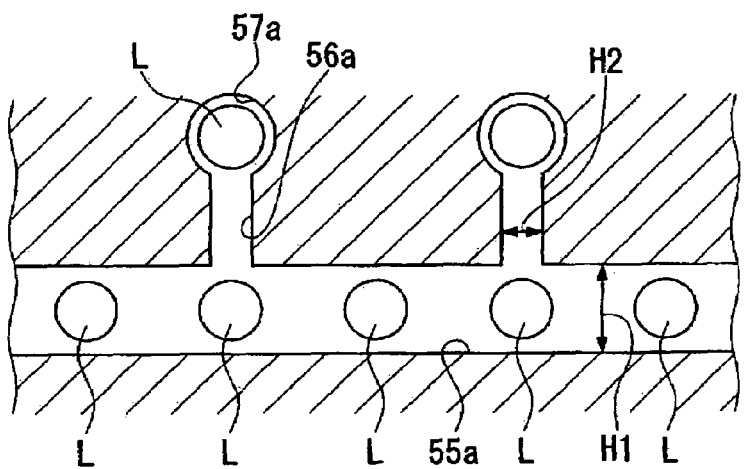

Subsequently, as shown in FIGS. 5C and 6B, the functional liquid L that is a wiring pattern forming material is discharged to the gate wire trench 55a and the gate electrode trench 56a with the droplet discharge device IJ. In the present embodiment, since the gate electrode trench 56a is a minute wiring pattern, it is difficult for the droplet discharge device IJ to directly discharge the functional liquid L thereto. Therefore, discharging of the functional liquid L to the gate electrode trench 56a is carried out by a method of causing the functional liquid L deposited in the gate wire trench 55a to be flowed into the gate electrode trench 56a by a capillary phenomenon as described above.

Specifically, first, the functional liquid L is discharged to the gate wire trench 55a as shown in FIGS. 5C and 6B. Here, part of the functional liquid L is discharged to the coupling part between the gate wire trench 55a and the gate electrode trench 56a, specifically, a region in which the axis passing through the center of the width H2 of the gate electrode trench 56a along the Y-axis direction intersects the axis passing through the center of the width H1 of the gate wire trench 55a along the X-axis direction. That is, the functional liquid L is discharged on such region that the discharged functional liquid L flows via the shortest path into the gate electrode trench 56a by a capillary phenomenon. Subsequently, the functional liquid L is similarly discharged to the region S1 of the gate electrode auxiliary trench 57a by the droplet discharge device IJ.

The functional liquid L deposited in the gate wire trench 55a by the droplet discharge device IJ wet-spreads inside the gate wire trench 55a as shown in FIGS. 5C and 6B. Similarly, the functional liquid L deposited in the gate electrode auxiliary trench 57a wet-spreads inside the gate electrode auxiliary trench 57a as shown in FIGS. 5C and 6B.

Figure 6C:
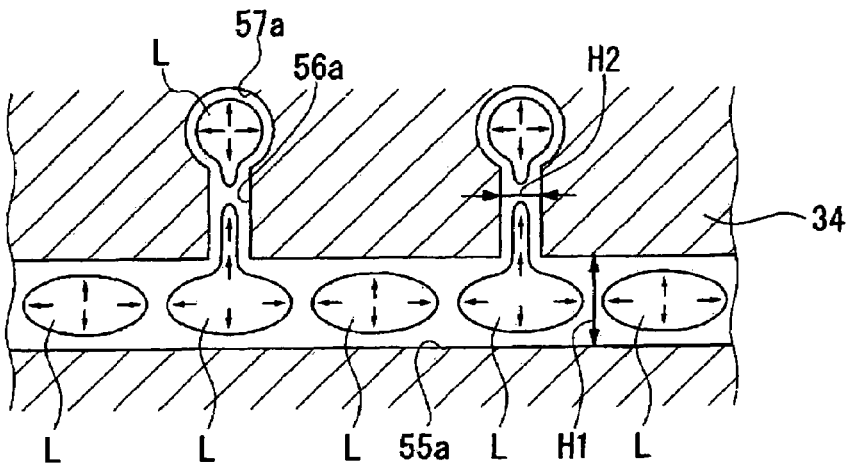

Furthermore, simultaneously with the wet-spreading in the gate wire trench 55a and the gate electrode auxiliary trench 57a, the functional liquid L flows into the gate electrode trench 56a by a capillary phenomenon as shown in FIG. 6C. Therefore, the functional liquid L can be supplied from both ends of the gate electrode trench 56a. A gate electrode 56 is formed through the above-described step. Similarly, the wet-spreading of the functional liquid L in the gate wire trench 55a forms a gate wire 55. In the present embodiment, a pattern formed of the functional liquid L deposited in the gate electrode auxiliary trench 57a (it will be referred to as a gate electrode auxiliary part 57 (the second recess), hereinafter) serves as the gate electrode 56 and constitutes part of the gate electrode 56.

Intermediate Drying Step

Subsequently, after the gate wire 55 and the gate electrode 56 are formed by depositing the functional liquid L to the gate wire trench 55a and the gate electrode trench 56a, drying treatment is carried out according to need. In order to obtain a desired thickness, the functional liquid deposition step may be repeated after the intermediate drying step. The drying treatment can be carried out by, for example, a typical hot plate, an electric furnace, lamp annealing or any other various methods for heating the substrate 48. Here, as a light source used for lamp annealing, an infrared lamp, xenon lamp, YAG laser, argon laser, carbon dioxide laser, or excimer laser of XeF, XeCl, XeBr, KrF, KrCl, ArF, ArCl, or the like can be used although there is no particular limitation. Typically a light source having output power in the range of 10 W to 5000 W is used. In the embodiment, the range of 100 W-1000 W is sufficient.

Baking Step

A dispersion medium needs to be completely removed from the dried film obtained after the discharge step of the functional liquid L, in order to enhance electric contact among the fine particles. In addition, if the surfaces of the conductive fine particles are coated with a coating material, such as an organic substance, to enhance dispersibility, this coating material also needs to be removed. Therefore, heat treatment and/or light treatment are implemented for the substrate after the discharge step.

The heat treatment and/or light treatment are typically carried out in an air atmosphere. If necessary, they may also be carried out in an inactive gas atmosphere, such as a hydrogen, nitrogen, argon, or helium atmosphere. The treatment temperature for the heat treatment and/or light treatment is appropriately determined with taking into consideration the boiling point (vapor pressure) of the dispersion medium, the kind and pressure of the atmospheric gas, the dispersibility, oxidizability and other thermal behaviors of the fine particles, the presence and volume of the coating material, the heat resistance temperature of the base material, and so on.

For example, removal of a coating material composed of an organic substance normally requires baking at about 300° C. Furthermore, in the case of using a substrate made of plastic or the like, it is preferable to carry out baking at a temperature in the range from a room temperature to 100° C.

Figure 5D:
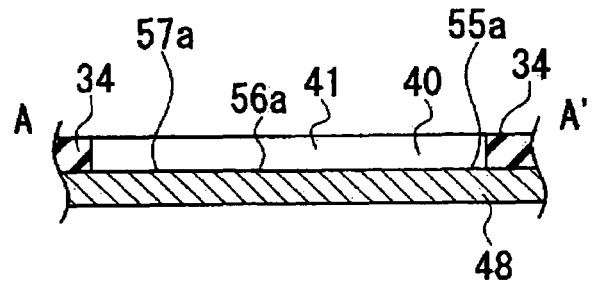

Through the above-described steps, the dried film obtained after the discharge step achieves ensured electric contact among the fine particles, and is converted to a conductive film with a certain thickness. Thus, as shown in FIG. 5D, a conductive pattern as a continuous film, i.e., the gate electrode 56 and the gate wire 55 can be formed.

According to the method of forming the bank structure of the present embodiment, the shape of the region (the gate electrode auxiliary trench 57a) on which the functional liquid L is disposed is equal to the shape during flight of the discharged functional liquid L. Therefore, the discharged functional liquid L can be accommodated in the gate electrode auxiliary trench 57a so as to be supplied to the gate electrode trench 56a without spilling out onto the upper surface of the bank 34 and the like.

Structure of Pixel

Next, a pixel formed with utilizing the above-described bank structure of the present embodiment and a method of forming a pixel will be described referring to FIGS. 7, 8A to 8E, 9A and 9B.

Figure 7:
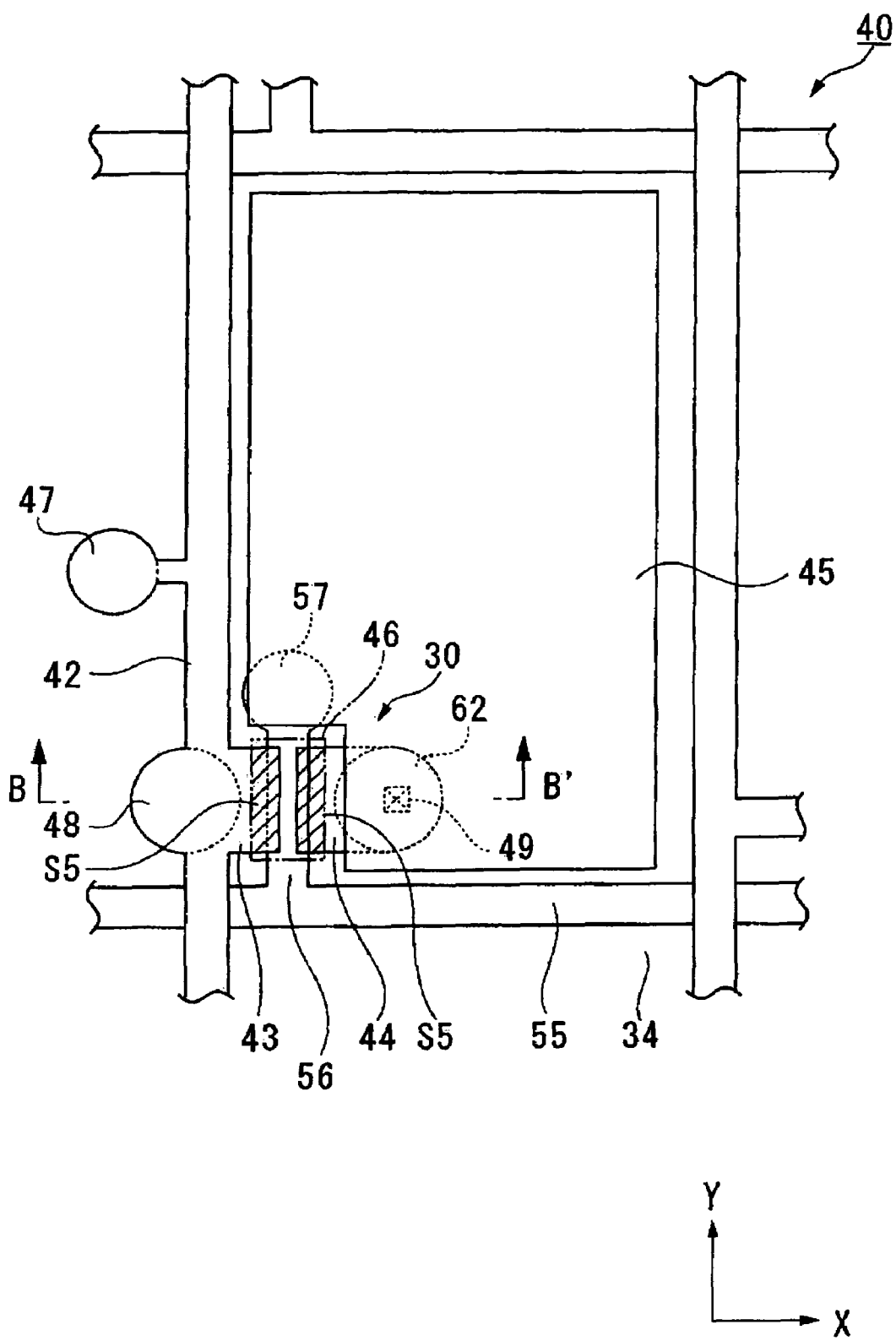
FIG. 7 is a plan view schematically illustrating one pixel in a display region.

FIG. 7 is a plan view illustrating the structure of one pixel 40 of the present embodiment.

As shown in FIG. 7, the pixel 40 includes on the substrate 48, the gate wire 55 (a third pattern) extending along the X-axis direction and the gate electrode 56 (a first pattern) formed to extend from the gate wire 55 along the Y-axis direction. In addition, the pixel 40 also includes a source wire 42 (the first pattern) formed along the Y-axis direction and intersecting the gate wire 55, and a source electrode 43 (the third pattern) formed to extend from the source wire 42 along the X-axis direction. Furthermore, the pixel 40 also includes a drain electrode 44 formed to face the source electrode 43 and a pixel electrode 45 coupled to the drain electrode 44.

The tip of the gate electrode 56 is formed in a round shape in plan view as shown in FIG. 7. The tip of the gate electrode 56 is the above-described gate electrode auxiliary part 57 to which the functional liquid L has been discharged. Thus, in the present embodiment, the gate electrode auxiliary part 57 is coupled to the gate electrode 56 to serve as the gate electrode 56, and constitutes part of the gate electrode 56.

Similarly, for part of the source wire 42, a part extending in a semicircular shape in plan view and a part extending in a round shape in plan view are formed as shown in FIG. 7. These parts are patterns 47 and 48 formed in the above-described source wire auxiliary trenches 47a and 48a to which the functional liquid L is discharged (they will be referred to as the source wire auxiliary parts 47 and 48 (the second patterns), hereinafter). Thus, in the present embodiment, the source wire auxiliary parts 47 and 48 are coupled to the source wire 42 to serve as the source wire 42, and constitute part of the source wire 42.

Furthermore, similarly, for part of the drain electrode 44, a part extending in a semicircular shape in plan view is formed as shown in FIG. 7. This part is a pattern 62 formed in the above-described drain electrode auxiliary trench 62a to which the functional liquid L is discharged (it will be referred to as the drain electrode auxiliary part 62 (the second pattern), hereinafter). Thus, in the present embodiment, the drain electrode auxiliary part 62 is coupled to the drain electrode to serve as the drain electrode 44, and constitutes part of the drain electrode 44.

In addition, the pixel electrode 45 is electrically coupled via a contact hole 49 to the drain electrode 44.

Here, as shown in FIG. 7, the width of the gate electrode 56 is smaller than the width of the gate wire 55. For example, the width of the gate electrode 56 is 10 μm while the width of the gate wire 55 is 20 μm. In addition, the width of the source electrode 43 is smaller than the width of the source wire 42. For example, the width of the source electrode 43 is 10 μm while the width of the source wire 42 is 20 μm. By thus forming, utilizing a capillary phenomenon allows the functional liquid L to be flowed into even minute patterns (the gate electrode 56 and the source electrode 43) to which the functional liquid L cannot be discharged directly.

Furthermore, as shown in FIG. 7 and FIG. 8 to be described later, an amorphous silicon film 46 (semiconductor layer) is formed between the gate electrode 56, and the source and drain electrodes 43 and 44. In the present embodiment, the area of the horizontal overlap between the source electrode 43 and the amorphous silicon film 46 is substantially equal to the area of the horizontal overlap between the drain electrode 44 and the amorphous silicon film 46. Thus, a TFT 30 having excellent electrical characteristics can be realized.

As described above, the gate electrode auxiliary part 57, the source wire auxiliary part 48 and the drain electrode auxiliary part 62 have a round shape whose width is almost as large as the diameter during flight of the functional liquid L.

Therefore, the area of a region to which the functional liquid L is to be discharged can be minimized, and thus costs of the functional liquid L can be reduced. Moreover, as for the gate electrode auxiliary part 57, lowering of the aperture ratio of the pixel electrode 45 formed adjacent to the gate electrode auxiliary part 57 can be suppressed to the minimum.

Pixel Forming Method

FIGS. 8A to 8E are sectional views illustrating forming steps of a pixel along the line B-B' shown in FIG. 7.

In the present embodiment, by utilizing the above-described bank structure and the pattern forming method, a pixel having the gate electrode, source electrode, drain electrode and so on of the bottom-gate TFT 30 is formed. In the following description, since the pixel forming method goes through the same steps as the above-described pattern forming steps shown in FIGS. 5A to 5D and 6A to 6C, the description of the steps will be omitted. In addition, structural components common to those shown in the above-described embodiment are given the same numerals.

Figure 8A:
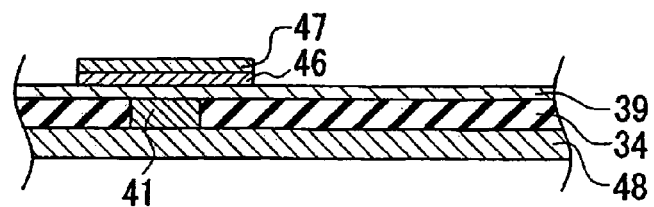
FIGS. 8A to 8E are sectional views illustrating forming steps of one pixel.

As shown in FIG. 8A, on the flat surface of the bank that includes wiring patterns formed through the steps shown in FIGS. 5A to 5D, a gate insulating film 39 is deposited by plasma CVD or the like. The gate insulating film 39 is composed of silicon nitride. Next, an amorphous silicon film is deposited on the gate insulating film 39. Subsequently, the amorphous silicon film is patterned to a certain shape by photolithography and etching, to form an amorphous silicon film 46 as shown in FIG. 8A.

Next, a contact layer 47 (n+ silicon film) is deposited on the amorphous silicon film 46. Subsequently, the contact layer 47 is patterned to a certain shape by photolithography and etching as shown in FIG. 8A.

Figure 8B:
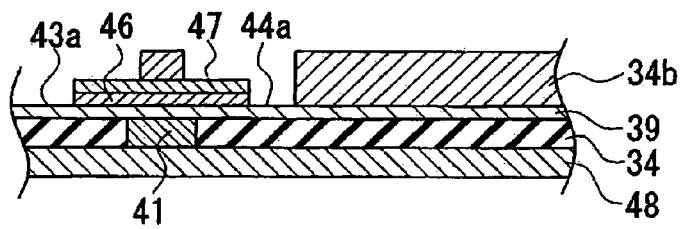

Next, as shown in FIG. 8B, a bank material 34b is applied on the entire surface including the surface of the contact layer 47 by spin coating or the like. Here, as the material constituting the bank material 34b, a polymer material, such as acrylic resin, polyimide resin, olefin resin or melamine resin, is preferably used since the material needs to have optical transparency and lyophobicity after being formed. $CF_4$ plasma treatment (plasma treatment employing a gas including a fluorine component) or the like is implemented to provide the bank material 34b with lyophobicity. In addition, instead of such treatment, it is also preferable that a lyophobic component (fluorine group or the like) is mixed in the bank material itself in advance. In this case, $CF_4$ plasma treatment or the like can be omitted. It is preferable to ensure that the contact angle of the functional liquid L with respect to the bank material 34b provided with lyophobicity in the above-described manner is at least 40°.

Next, the bank 34b for source and drain electrodes, with the size one-twentieth to one-tenth one pixel pitch, is formed. Specifically, first, by photolithography, the source electrode trench 43a is formed at the position corresponding to the source electrode 43, in the bank material 34 applied on the upper surface of the gate insulating film 39 while the drain electrode trench 44a is similarly formed at the position corresponding to the drain electrode 44.

Figure 8C:
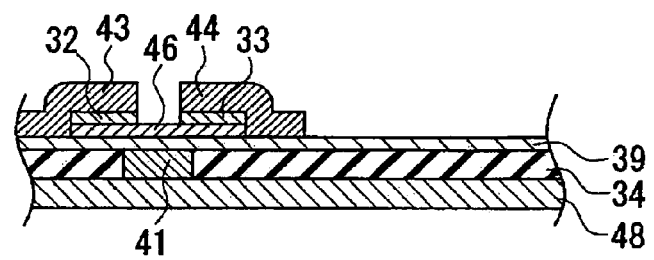

Subsequently, the functional liquid L is deposited in the source electrode trench 43a and the drain electrode trench 44a formed in the bank 34b for source and drain electrodes, to thereby form the source and drain electrodes 43 and 44. Specifically, first, the functional liquid L is deposited in the source wire trench with the droplet discharge device IJ (illustration is omitted). The width of the source electrode trench 43a is smaller than the width of the source wire trench. Therefore, the functional liquid L deposited in the source wire trench flows into the source electrode trench 43a by a capillary phenomenon. Thus, the source electrode 43 is formed as shown in FIG. 8C. The drain electrode 44 is formed in the similar method.

Subsequently, as shown in FIG. 8C, the bank 34b for source and drain electrodes is removed after the formation of the source electrode 43 and the drain electrode 44. Then, the N+ silicon film of the contact layer 47 formed between the source electrode 43 and the drain electrode 44 is etched with utilizing as a mask each of the source and drain electrodes 43 and 44 that remain on the contact layer 47. This etching treatment removes the N+ silicon film of the contact layer 47 formed between the source and drain electrodes 43 and 44, to expose part of the amorphous silicon film 46 formed under the N+ silicon film. Thus, a source region 32 composed of N+ silicon is formed under the source electrode 43 while a drain region 33 composed of N+ silicon is formed under the drain electrode 44. Furthermore, under these source and drain regions 32 and 33, a channel region (the amorphous silicon film 46) composed of amorphous silicon is formed.

Through the above-described steps, the bottom-gate TFT 30 is formed.

Figure 8D:
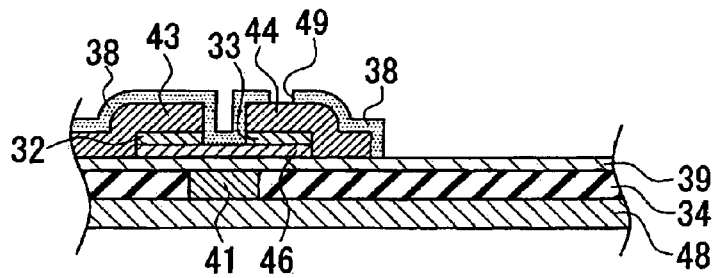

Next, as shown in FIG. 8D, over the source electrode 43, the drain electrode 44, the source region 32, the drain region 33, and the exposed silicon layer, a passivation film 38 (protective film) is deposited by vapor deposition, sputtering or the like. Subsequently, the passivation film 38 on the gate insulating film 39 on which the pixel electrode 45 to be described later is to be formed is removed by photolithography and etching. Simultaneously, the contact hole 49 is formed in the passivation film 38 on the drain electrode 44 in order to electrically couple the pixel electrode 45 to the drain electrode 44.

Figure 8E:
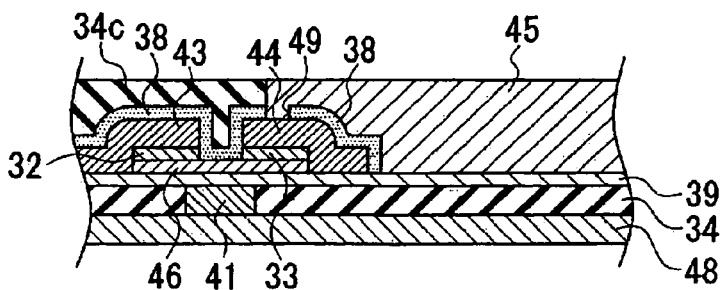

Next, as shown in FIG. 8E, a bank material is applied on a region including the gate insulating film 39 on which the pixel electrode 45 is to be formed. Here, the bank material includes a material, such as acrylic resin or polyimide resin, as described above. Subsequently, lyophobic treatment is implemented for the upper surface of the bank material (a bank 34c for pixel electrode) by plasma treatment or the like. Next, by photolithography, a pixel electrode trench is formed in a region in which the pixel electrode 45 is to be formed, to form the bank 34c for pixel electrode.

Subsequently, the pixel electrode 45 composed of ITO (indium tin oxide) is formed in a region defined by the bank 34c for pixel electrode by an ink jet method. In addition, filling the contact hole 49 with the pixel electrode 45 ensures electrical coupling between the pixel electrode 45 and the drain electrode 44. In the present embodiment, lyophobic treatment is implemented for the upper surface of the bank 34c for pixel electrode. Therefore, the pixel electrode 45 can be formed without spilling out from the pixel electrode trench.

Second Embodiment

In the following, the present embodiment will be described with reference to the drawings. In the present embodiment, the structure of the drain electrode trench 44a corresponding to the drain electrode 44 included in the TFT 30 will be described.

In the above-described first embodiment, the drain electrode trench 44a corresponding to the drain electrode is formed in a rectangular shape in plan view. In contrast, the present embodiment is different from the first embodiment in that the drain electrode trench 44a is formed in an L-shape in plan view. Other basic configurations are the same as those of the first embodiment. Common structural elements are given the same numerals and the detailed description thereof will be omitted.

Figure 9A:
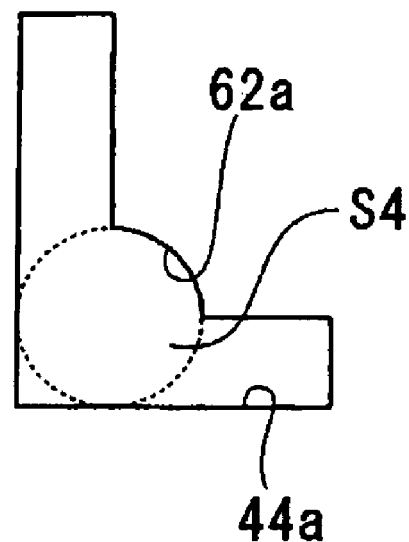
FIGS. 9A and 9B are plan views schematically illustrating a bank structure that corresponds to a drain electrode of another embodiment.
Figure 9B:
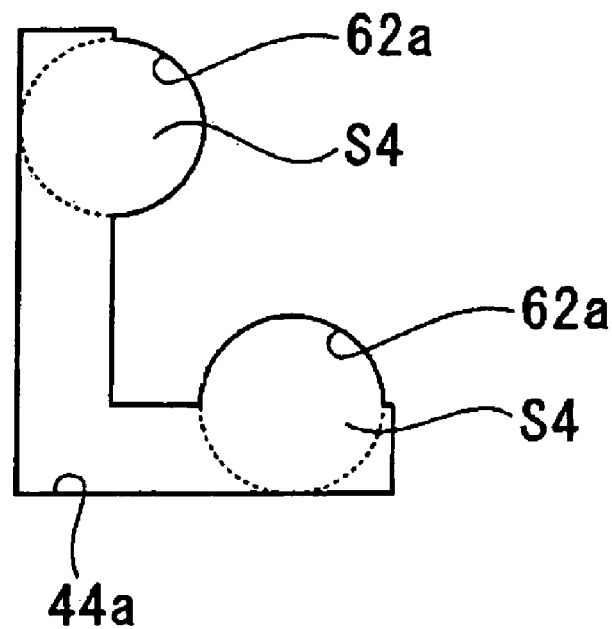

FIGS. 9A and 9B are plan views illustrating the structure of the drain electrode trench 44a that corresponds to the drain electrode 44 of the present embodiment. Here, "inner side of the drain electrode trench 44a" indicates the acute angle side of the intersection of sides of the L-shaped drain electrode trench 44a, and "outer side" indicates the region on the opposite side of the inner side.

As shown in FIG. 9A, the drain electrode auxiliary trench 62a is formed in a round shape in plan view at the inner side of the bend part of the L-shaped drain electrode trench 44a. Specifically, the drain electrode auxiliary trench 62a is formed in a manner of overlapping part of the drain electrode trench 44a, and is in the state of extending from the bend part of the drain electrode trench 44a in a fan shape in plan view. Thus, the drain electrode auxiliary trench 62a is coupled to the drain electrode trench 44a and constitutes part of the drain electrode 44. Furthermore, the width of the drain electrode auxiliary trench 62a is almost equal to or larger than the diameter during flight of the functional liquid L discharged from the droplet discharge device IJ. That is, in the present embodiment, the drain electrode auxiliary trench 62a serves as the region S4 to which the functional liquid L is discharged, and has such a structure that the functional liquid L does not spill out onto the upper surface of the bank 34.

In addition, it is also preferable to form the drain electrode auxiliary trench 62a provided for the drain electrode trench 44a at positions different from the position shown in FIG. 9A. Specifically, the drain electrode auxiliary trenches 62a are formed in a round shape in plan view at the inner sides of both tips of the L-shaped drain electrode trench 44a. In detail, the drain electrode auxiliary trenches 62a are formed in a manner of overlapping part of the drain electrode trench 44a, and extend from the drain electrode trench 44a toward the inner side in a semicircular shape in plan view. Thus, the drain electrode auxiliary trenches 62a are coupled to the drain electrode trench 44a and constitute part of the drain electrode 44. Furthermore, the widths of the drain electrode auxiliary trenches 62a are almost equal to or larger than the diameter during flight of the functional liquid L discharged from the droplet discharge device IJ. That is, in the present embodiment, the drain electrode auxiliary trenches 62a serve as the region S4 to which the functional liquid L is discharged, and have such a structure that the functional liquid L does not spill out onto the upper surface of the bank 34.

As described above, even if the drain electrode 44 is formed in an L-shape and the width of the drain electrode 44 is smaller than the diameter during flight of the discharged functional liquid L, provision of the drain electrode auxiliary trench 62a allows formation of the drain electrode 44 with a desired shape without leaving residues of the functional liquid L on the upper surface of the bank 34.

Electro-optical Device

Next, a description will be made about a liquid crystal display that is one example of an electro-optical device according to an embodiment of the invention having pixels formed by the method of forming a pattern that has the above-described bank structure.

Figure 10:
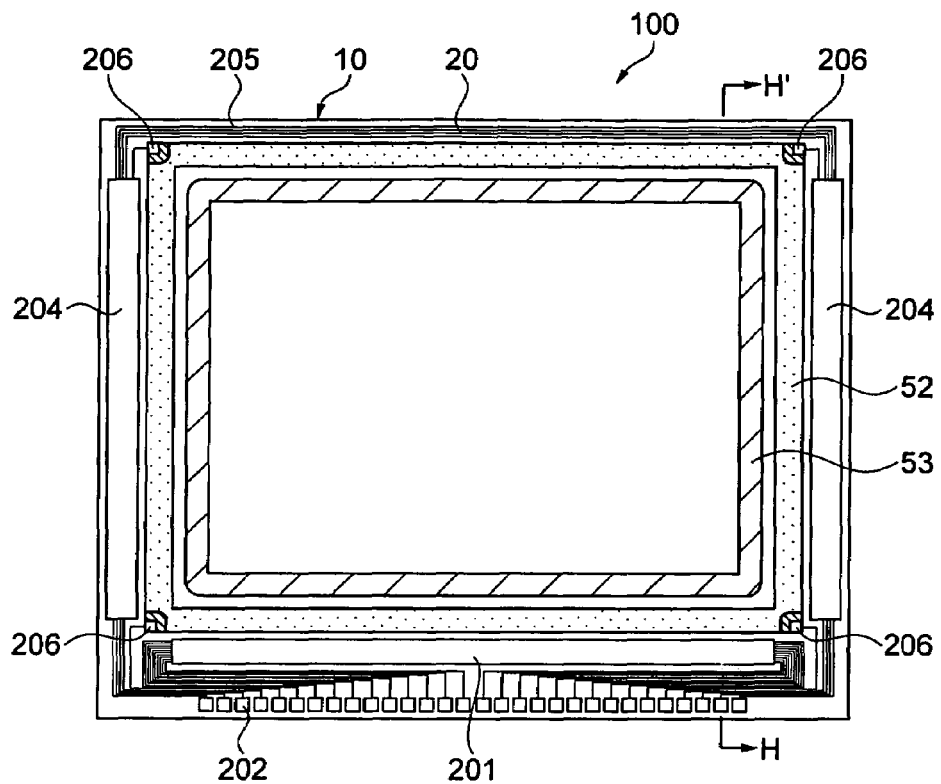
FIG. 10 is a plan view obtained by viewing a liquid crystal display from the counter substrate side.

FIG. 10 is a plan view illustrating a liquid crystal display according to an embodiment of the invention and each constitutional element. This diagram is obtained by viewing the display from a counter substrate side.

Figure 11:
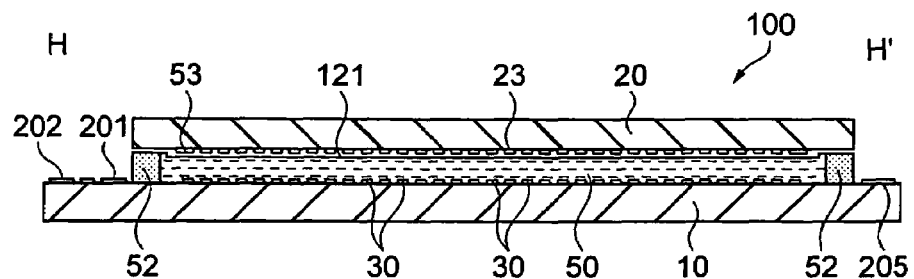
FIG. 11 is a sectional view of the liquid crystal display along the line H-H' of FIG. 10.
Figure 12:
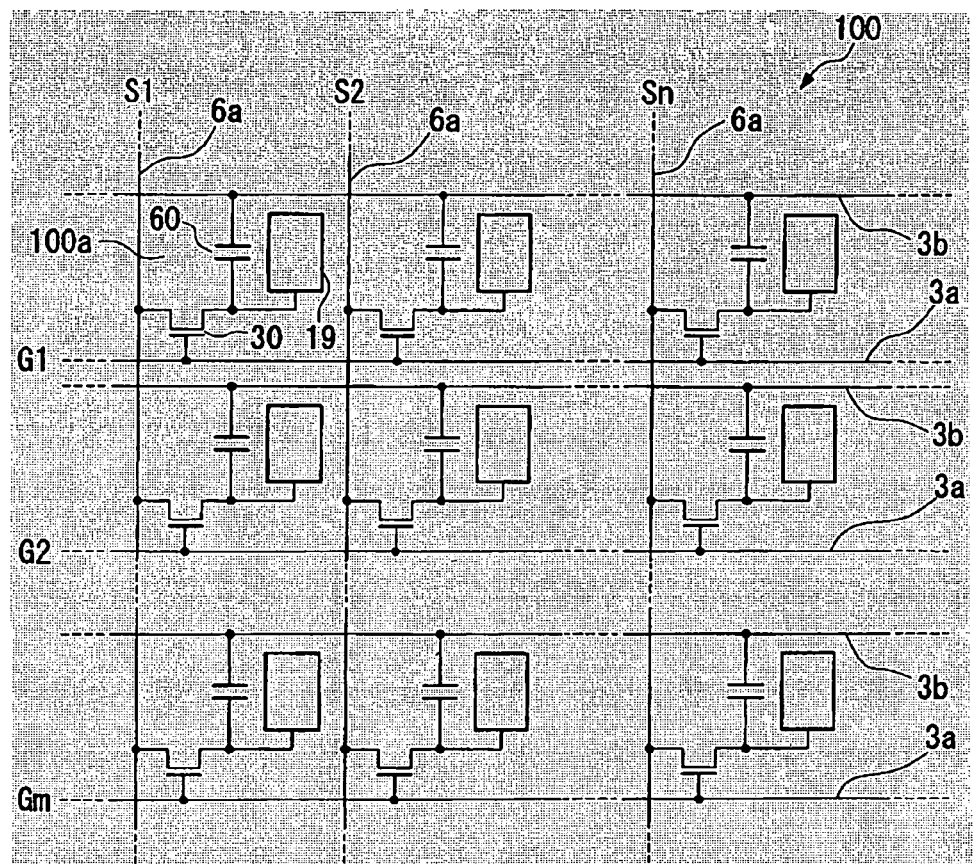
FIG. 12 is a circuit diagram of the liquid crystal display.

FIG. 11 is a sectional view along the line H-H' of FIG. 10.
FIG. 12 is an equivalent circuit diagram of each of elements and wires in a plurality of pixels arranged in a matrix in an image display region of the liquid crystal display. In each drawing used for the following description, in order to illustrate each layer and each member with such size to be recognizable on the drawings, the scale thereof is adequately changed for each layer and each member.

Referring to FIGS. 10 and 11, in a liquid crystal display (electro-optical device) 100 of the present embodiment, a TFT array substrate 10 and a counter substrate 20 that constitute a pair are applied to each other with a sealing material 52 that is an light-curable sealant, and a liquid crystal 50 is enclosed and held in a region defined by the sealing material 52. The sealing material 52 is formed in a closed-frame shape on a region in the substrate surface. The sealing material 52 has no liquid crystal injection port and thus provides a structure having no trace of sealing with a sealant.

In the inside of the region on which the sealing material 52 is formed, a peripheral partition 53 composed of a light-shielding material is formed. On the outside region of the sealing material 52, a data line drive circuit 201 and mounting terminals 202 are formed along one side of the TFT array substrate 10. Scan line drive circuits 204 are formed along two sides adjacent to the one side. Provided along rest one of sides of the TFT array substrate 10 are a plurality of wires 205 for coupling the scan line drive circuits 204 provided at both sides of the image display region to each other. In addition, on at least one position of each corner of the counter substrate 20, an inter-substrate conductive material 206 is provided to electrically couple the TFT array substrate 10 to the counter substrate 20.

Instead of forming the data line drive circuit 201 and the scan line drive circuits 204 on the TFT array substrate 10, for example, a tape automated bonding (TAB) substrate on which drive LSIs are mounted may electrically or mechanically be coupled to terminals formed on the periphery of the TFT array substrate 10 with an anisotropic conductive film. In the liquid crystal display 100, although not illustrated in the drawing, a phase difference plate, polarizing plate and so on are disposed with a certain orientation depending on the kind of the liquid crystal 50 to be used, i.e., which operational mode of a twisted nematic (TN) mode, C-TN method, VA method, IPS method mode or the like, and which type of a normally white mode or normally black mode.

In addition, in the case of forming the liquid crystal display 100 for color displaying, for example, a color filter of red (R), green (G) and blue (B) together with a protective film therefor is formed on a region, on the counter substrate 20, facing each pixel electrode to be described later of the TFT array substrate 10.

In the image display region of the liquid crystal display 100 having such a structure, as shown in FIG. 12, a plurality of pixels 100a are arranged in a matrix and the TFT (switching element) 30 for pixel switching is provided for each pixel 100a. Data lines 6a that supply pixel signals S1, S2, ..., and Sn are electrically coupled to sources of the TFTs 30. The pixel signals S1, S2, ..., and Sn, which are written to the data lines 6a, may line-sequentially be supplied in that order, or may be supplied by a group to the plurality of data lines 6a adjacent to each other. Furthermore, scan lines 3a are electrically coupled to gates of the TFTs 30, and scan signals G1, G2, ..., and Gm are line-sequentially applied to the scan lines 3a in that order in a pulse manner at given timing.

Pixel electrodes 19 are electrically connected to drains of the TFTs 30. The TFTs 30, which are switching elements, are switched on during a certain period, and thereby the pixel electrodes 19 write to the respective pixels the pixel signals S1, S2, ..., and Sn supplied from the data lines 6a at given timing. The pixel signals S1, S2, . . . , and Sn of a certain level thus written to the liquid crystal via the pixel electrodes 19 are held during a certain period between the pixel electrodes 19 and counter electrodes 121 of the counter substrate 20 shown in FIG. 11. In order to prevent leakage of the held pixel signals S1, S2, . . . , and Sn, accumulation capacitances 60 are provided parallel to liquid crystal capacitances formed between the pixel electrodes 19 and the counter electrodes 121. For example, the voltage of the pixel electrode 19 is held by the accumulation capacitance 60 for a time period longer, by three orders of magnitude, than a time period during which the source voltage is applied. Thus, the charge holding characteristic is improved, which can realize the liquid crystal display 100 having a high contrast ratio.

Next, another embodiment different from the above-described electro-optical device (liquid crystal display 100) will be described.

Figure 13:
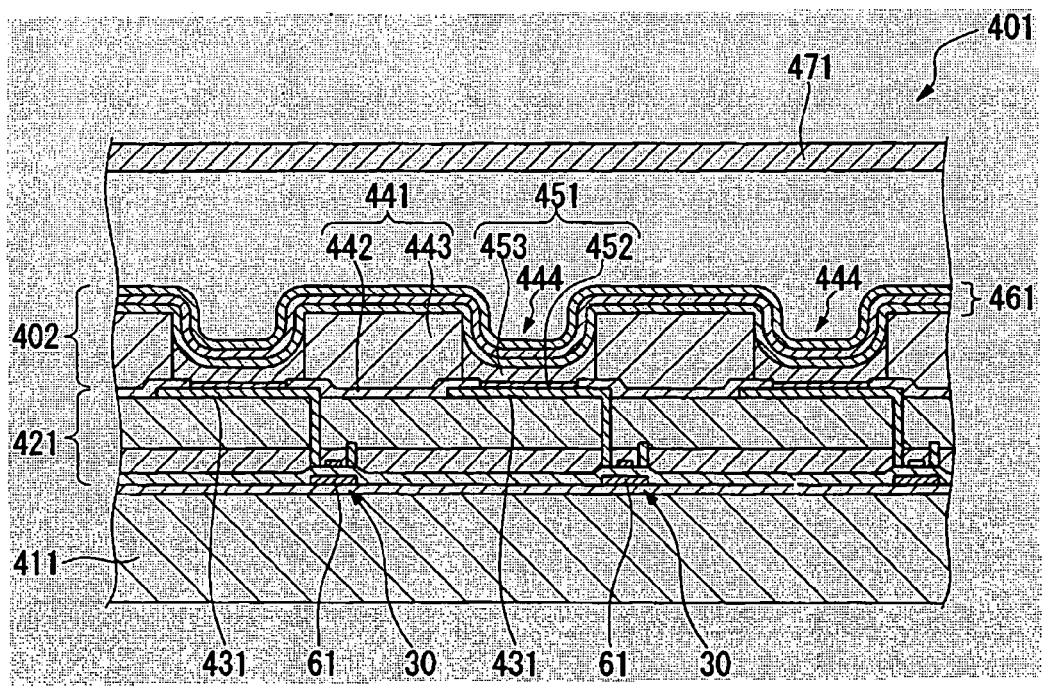
FIG. 13 is a partly enlarged sectional view of an organic EL device.

FIG. 13 is a side sectional view of an organic EL device having pixels formed by using the above-described bank structure and the pattern forming method. In the following, the schematic structure of the organic EL device will be described with reference to FIG. 13.

Referring to FIG. 13, an organic EL device 401 is obtained by coupling wires and drive ICs (not shown) of a flexible substrate (not shown) with an organic EL element 402 that is composed of a substrate 411, a circuit element part 421, pixel electrodes 431, banks 441, light-emitting elements 451, a cathode 461 (counter electrode) and a sealing substrate 471. In the circuit element part 421, TFTs 60 that are an active element are formed on the substrate 411. The plurality of pixel electrodes 431 are arranged on the circuit element part 421. Gate wires 61 of the TFTs 60 are formed by the method of forming a wiring pattern of the above-described embodiment.

The banks 441 are formed in a grid among the pixel electrodes 431. The light-emitting elements 451 are formed in recess openings 444 generated due to the banks 441. The light-emitting element 451 is composed of an element emitting red light, an element emitting green light and an element emitting blue light. Thus, the organic EL device 401 realizes full-color displaying. The cathode 461 is formed over the entire surfaces of the banks 441 and the light-emitting elements 451. The sealing substrate 471 is deposited over the cathode 461.

A fabrication process for the organic EL device 401 having organic EL elements includes a bank forming step of forming the banks 441, a plasma treatment step for adequately forming the light-emitting elements 451, a light-emitting element forming step of forming the light-emitting elements 451, a counter electrode forming step of forming the cathode 461, and a sealing step of depositing the sealing substrate 471 over the cathode 461 to seal the EL device.

The light-emitting element forming step is to form the light-emitting elements 451 by forming hole injection layers 452 and light-emitting layers 453 in the recess openings 444, i.e., on the pixel electrodes 431. The light-emitting element forming step includes a hole injection layer forming step and a light-emitting layer forming step. The hole injection layer forming step includes a first discharge step of discharging on the pixel electrodes 431a liquid material for forming the hole injection layers 452, and a first drying step of drying the discharged liquid material to form the hole injection layers 452. In addition, the light-emitting layer forming step includes a second discharge step of discharging on the hole injection layers 452 a liquid material for forming the light-emitting layers 453, and a second drying step of drying the discharged liquid material to form the light-emitting layers 453. Three kinds of the light-emitting layers 453 are formed of materials corresponding to three colors of red, green and blue as described above. Therefore, the above-described second discharge step includes three steps in order to discharge each of the three kinds of materials.

In the light-emitting element forming step, the above-described droplet discharge device IJ can be used for the first discharge step of the hole injection layer forming step and the second discharge step of the light-emitting layer forming step.

In addition, as the device (electro-optical device) according to an embodiment of the invention, besides the above-description, a plasma display panel (PDP), a surface-conduction electron-emitting device that utilizes a phenomenon of electron emission caused by applying a current to a small-area thin film formed on a substrate parallel to the film surface, and other devices can be applied.

Electronic Apparatus

Next, specific examples of electronic apparatus of an embodiment of the invention will be described.

Figure 14:
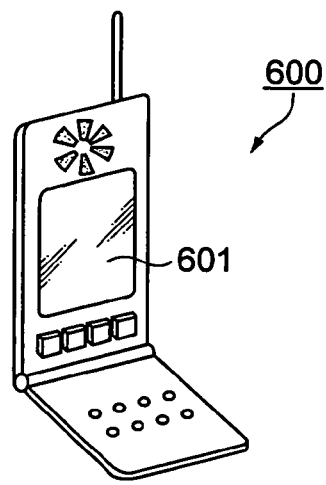
FIG. 14 is a diagram illustrating an specific example of electronic apparatus of an embodiment of the invention.

FIG. 14 is a perspective view illustrating one example of a cellular phone. Referring to FIG. 14, numeral 600 indicates a cellular phone body, and numeral 601 indicates a liquid crystal display part including a liquid crystal display of the above-described embodiment.

The electronic apparatus shown in FIG. 14 has the liquid crystal display formed by the method of forming a pattern including the bank structure of the above-described embodiment, and therefore achieves high quality and performance.

Although the electronic apparatus of the present embodiment includes a liquid crystal device, an electronic apparatus including another electro-optical device, such as an organic electro-luminescence display or plasma display, is available.

Next, a description will be made about an example in which a pattern formed by the method of forming a pattern having the bank structure of the embodiment is applied to an antenna circuit.

Figure 15:
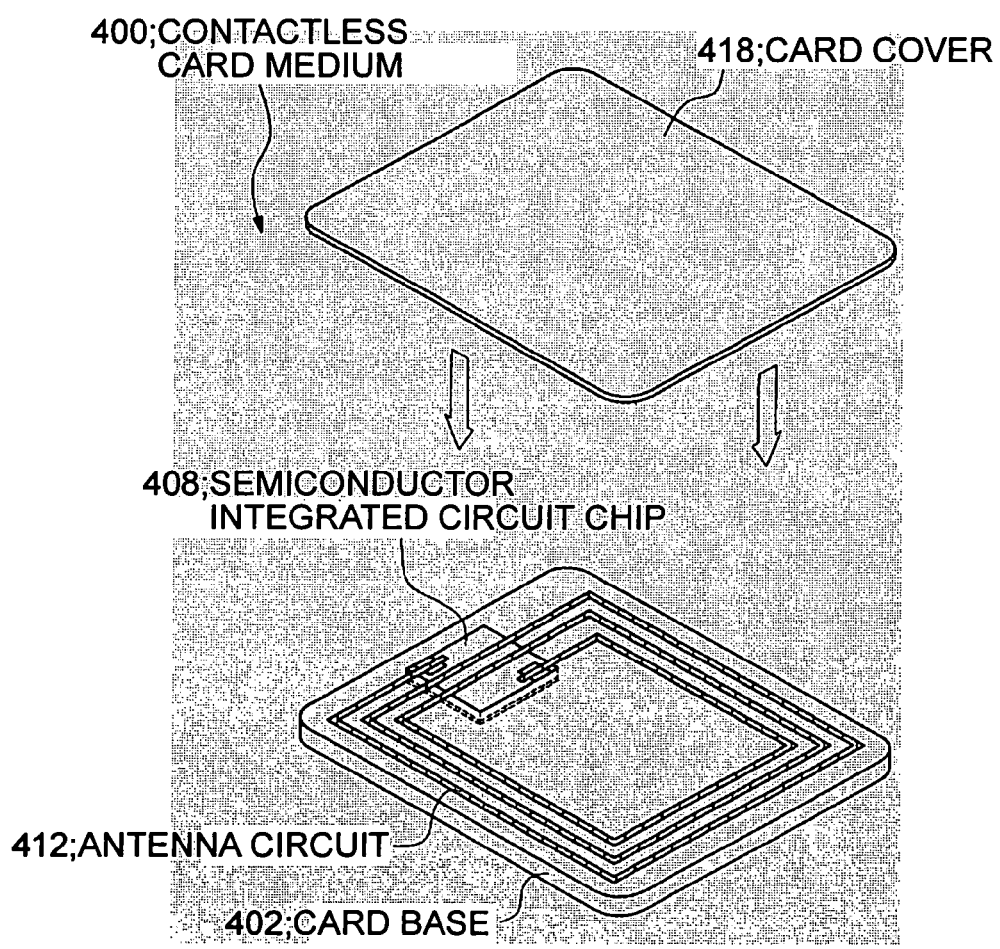
FIG. 15 is an exploded perspective view of a contactless card medium.

FIG. 15 illustrates a contactless card medium according to the present embodiment. A contactless card medium 400 incorporates a semiconductor integrated circuit chip 408 and an antenna circuit 412 in a case composed of a card base 402 and a card cover 418. The contactless card medium 400 implements at least one of power supply and data exchange with an external transmitter/receiver (not shown) by at least one of electromagnetic waves and capacitance coupling.

In the present embodiment, the antenna circuit 412 is formed based on the method of forming a pattern of the embodiment. Therefore, miniaturization and line-width reduction of the antenna circuit 142 is achieved and thus high quality and performance can be achieved.

The invention can be applied to, besides the above-described electronic apparatus, various pieces of electronic apparatus. The invention can also be applied to, for example, liquid crystal projectors, multimedia-enabled personal computers (PC), engineering work stations (EWS), pagers, word processors, televisions, video recorders of viewfinder types or monitor viewing types, electronic notebooks, electric calculators, car navigations systems, point-of-sale (POS) terminals, and apparatus equipped with a touch panel.

Preferred embodiments according to the present invention have been described with reference to the accompanying drawings as described above. However, it should be obvious that the present invention is not limited to the embodiments. The shapes, combinations and so on of the constitutional members shown in the above-described embodiments are examples, and various modifications can be made based on design demands and so on without departing from the gist of the present invention.

For example, in the above-described embodiment, the shape of the discharge region to which a functional liquid is discharged is a round shape in plan view. Instead of this, it is also preferable to form the discharge region in a shape having a circular arc in at least part of the outer circumference. Specifically, any of various shapes, such as an ellipse shape and track shape, can be adopted.

In addition, in the above-described embodiment, desired trenches (for example, the gate electrode trench) are formed in the banks by photolithography and etching. Instead of this, it is also preferable that the banks are patterned by using a laser to form desired trenches.

What is claimed is:

1. A bank structure in which a recess corresponding to a pattern formed of a functional liquid is provided, comprising:
    a first recess provided corresponding to a first pattern; and
    a second recess provided adjacent to the first recess in plan view and corresponding to a second pattern, the second recess having a shape that has a width larger than a width of the first recess and has a circular arc in at least part of an outer circumference of the second recess.

2. The bank structure according to claim 1, wherein the second recess has a round shape in plan view.

3. The bank structure according to claim 1, further comprising:
    a third recess provided corresponding to a third pattern that is coupled to the first pattern and has a width larger than a width of the first pattern.

4. A device including a semiconductor layer provided over a substrate, source and drain electrodes coupled to the semiconductor layer, and a gate electrode provided facing the semiconductor layer with an insulating film therebetween, the device comprising:
    the bank structure according to claim 3; and
    a pattern disposed in each of the first, second and third recesses of the bank structure, wherein the first pattern is the gate electrode and the third pattern is a gate wire.

5. The device according to claim 4, wherein an area of a horizontal overlap between the source electrode and the semiconductor layer is almost equal to an area of a horizontal overlap between the drain electrode and the semiconductor layer.

6. The bank structure according to claim 1, further comprising:
    a third recess corresponding to a third pattern that is coupled to the second pattern.

7. A device including a semiconductor layer provided over a substrate, source and drain electrodes coupled to the semiconductor layer, and a gate electrode provided facing the semiconductor layer with an insulating film therebetween, the device comprising:
    the bank structure according to claim 6; and
    a pattern disposed in each of the first, second and third recesses of the bank structure, wherein the first pattern is a source wire and the third pattern is the source electrode.

8. A device including a semiconductor layer provided over a substrate, source and drain electrodes coupled to the semiconductor layer, and a gate electrode provided facing the semiconductor layer with an insulating film therebetween, the device comprising:
    the bank structure according to claim 1; and
    a pattern disposed in each of the first and second recesses of the bank structure, wherein the first pattern is the drain electrode.

9. An electro-optical device comprising the device according to claim 8.

10. An electronic apparatus comprising the electro-optical device according to claim 9.

11. A method of forming a bank structure that has recesses corresponding to a plurality of patterns formed of a function liquid on a substrate, comprising:
    applying a bank material on the substrate;
    forming a first recess corresponding to a first pattern in the bank material; and
    forming a second recess corresponding to a second pattern adjacent to the first recess in plan view in the bank material, the second recess having a shape that has a width larger than a width of the first recess and has a circular arc in at least part of an outer circumference of the second recess.

* * * * *